United States Patent

Steudel

[15] 3,702,446

[45] Nov. 7, 1972

[54] VOLTAGE-CONTROLLED OSCILLATOR USING COMPLEMENTARY SYMMETRY MOSFET DEVICES

[72] Inventor: Goetz Wolfgang Steudel, Flemington, N.J.

[73] Assignee: RCA Corporation

[22] Filed: Sept. 7, 1971

[21] Appl. No.: 178,331

[52] U.S. Cl. ..................331/111, 307/205, 307/215, 307/288, 331/108 D, 331/110, 331/113 R, 331/177 R

[51] Int. Cl. ..........................................H03k 3/282

[58] Field of Search ......331/111, 113 R, 110, 108 D, 331/177 R, 36 R

[56] References Cited

UNITED STATES PATENTS

| | | | |
|---|---|---|---|
| 3,568,091 | 3/1971 | Rahe | 331/113 R |
| 3,618,131 | 11/1971 | Garde | 331/111 X |

*Primary Examiner*—Roy Lake
*Assistant Examiner*—Siegfried H. Grimm
*Attorney*—Edward J. Norton

[57] ABSTRACT

A voltage-controlled oscillator that is compatible with integrated circuit techniques and comprises complementary symmetry MOSFET devices to provide linear operation over several frequency decades, and exhibits high input impedance and minimum power consumption. The frequency of operation is controlled by a current source which is controlled solely by an input voltage. The constant current source linearly charges a capacitor through a bridge circuit. The bridge circuit which includes two complementary MOSFET transistors in each arm is connected across the current source and arranged so that when one transistor in an arm switches on the diagonally opposite transistor, in the other arm, also switches on. The rising voltage across the capacitor is used to change the state of a bistable multivibrator when a given threshold voltage is reached. The output of the bistable multivibrator discharges the capacitor, causes the capacitor to be charged in the opposite direction and provides an output terminal for the voltage-controlled oscillator.

23 Claims, 8 Drawing Figures

INVENTOR.
GOETZ W. STEUDEL
BY Edward J. Norton
ATTORNEY

INVENTOR.
GOETZ W. STEUDEL
BY
Edward J. Norton
ATTORNEY

INVENTOR.
GOETZ W. STEUDEL
BY
Edward J Norton
ATTORNEY

VOLTAGE-CONTROLLED OSCILLATOR USING COMPLEMENTARY SYMMETRY MOSFET DEVICES

BACKGROUND OF THE INVENTION

The present invention relates to voltage-controlled oscillators and, more particularly, to a voltage-controlled oscillator in which the frequency of operation is controlled by a variable-level current source.

Hand held personal portable communications equipment such as pocket receivers and other small portable devices are well known. Since these devices are generally battery powered, the available power is limited by the small size of the battery. In order to reduce the total component count, and therefore the size and battery consumption, integrated circuit phase locked loops have been employed in these devices as detecting and demodulating circuits.

Circuits using a phase locked loop require a voltage-controlled oscillator. A limitation found in many prior art voltage-controlled oscillators is that the power dissipation precludes their use where available power is limited. A further limitation is the limited operating frequency range and lack of linearity in response to a control voltage. Another disadvantage of prior art voltage-controlled oscillators is their relatively low input impedance, which complicates the design of the low pass filters normally connected to the input in phase locked loop applications.

The present invention overcomes these limitations by providing a linear voltage-controlled oscillator of small size and low power dissipation having a high input impedance.

SUMMARY OF THE INVENTION

The voltage-controlled oscillator of the present invention comprises a bridge circuit including a first pair of serially coupled complementary transistors forming one arm of the bridge and a second pair of serially coupled complementary transistors forming the other arm of the bridge. Means are provided for coupling a current source between a first terminal formed by one junction of the first pair of the second pair and a second terminal formed by the other junction of the first pair and the second pair. Means are provided for coupling a bistable means between a third terminal formed by the junction of the transistors in the first pair and a fourth terminal formed by the junctions of the transistors in the second pair. A first output of the bistable means is coupled to the control electrodes of the transistors in the first pair and a complementary output of the bistable means is coupled to the control electrodes of the transistors in the second pair and means are provided for deriving an output from the bistable means.

DETAILED DESCRIPTION

Figure 1:
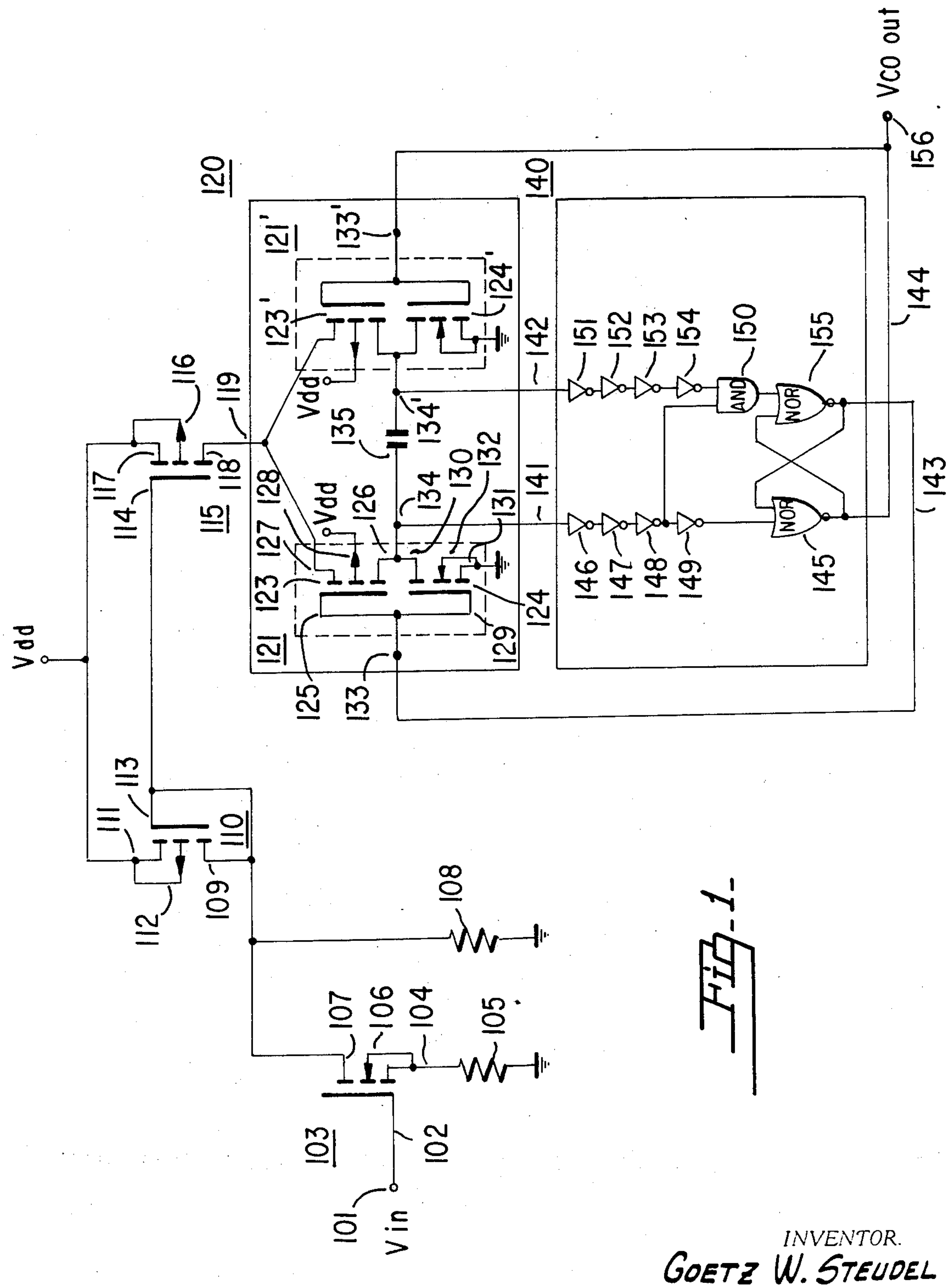
FIG. 1 is a combined block and schematic diagram of a voltage-controlled oscillator in accordance with one embodiment of the present invention.

All transistors shown in FIG. 1 are of the metal oxide silicon field effect transistor or MOSFET type and are operated in the enhancement mode. The input terminal 101 of the voltage-controlled oscillator shown in FIG. 1 is connected to the gate electrode 102 of N-channel MOSFET transistor 103. The source electrode 104 of transistor 103 is connected by way of resistor 105 to a point of reference potential such as ground. The substrate 106 of transistor 103 is connected to its source electrode 104.

The drain electrode 107 of transistor 103 is connected to the junction formed by resistor 108 and the drain electrode 109 of P-channel MOSFET transistor 110. The other terminal of resistor 108 is connected to ground. The source electrode 111 of transistor 110 is connected to a positive supply potential $V_{dd}$. The substrate 112 of transistor 110 is connected to its source 111. The gate electrode 113 of transistor 110 is connected to the junction formed by drain electrode 109 of transistor 110 and the gate electrode 114 of P-channel MOSFET transistor 115. The substrate 116 of transistor 115 is connected to its source electrode 117 which, in turn, is connected to $V_{dd}$. The drain electrode 118 of transistor 115 is connected by way of input lead 119 to bridge circuit 120.

Bridge circuit 120 includes a pair of complementary symmetry inverters 121 and 121' . Inverter 121 comprises a complementary pair of transistors 123 and 124. Transistor 123 is a channel MOSFET having a gate electrode 125, drain electrode 126, source electrode 127 and substrate 128. Transistor 124 is an N-channel MOSFET and includes a gate electrode 129, drain electrode 130, source electrode 131 and substrate 132. The substrate 128 is connected to $V_{dd}$. The substrate 132 is connected to ground. The gate electrodes 125 and 129 are connected to the inverter input terminal 133 and the drain electrodes 126 and 130 are connected to the inverter output terminal 134. The source electrode 127 of transistor 125 is connected to the input lead 119 of bridge circuit 120 and the source electrode 131 of transistor 124 is connected to ground. Inverter 121' comprising transistors 123' and 124' is identical in function and structure to inverter 121 as described above. The output of inverter 121 is connected to the output of inverter 121' by way of capacitor 135.

The output terminal 134 of inverter 121 is connected to a first input of bistable multivibrator 140 by way of lead 141 and the output terminal 134' of inverter 121' is connected to a second input of bistable 140 by way of lead 142. A first output of bistable multivibrator 140 is connected to input terminal 133 of inverter 121 by way of lead 143 and a second, complementary, output is connected to input terminal 133' of inverter 121' by way of lead 144, which is also connected to the oscillator output terminal 156.

The first input to bistable multivibrator 140 on line 141 is connected to a first input of NOR gate 145 by way of serially connected inverters 146, 147, 148, and 149. The second input of bistable 140 is connected to one input of AND gate 150 by way of serially connected inverters 151, 152, 153, and 154. The serially connected inverters provide delay networks as explained hereinafter. The output of inverter 148 is connected to the other input of AND gate 150, and the output of AND gate 150 is connected to a first input of NOR gate 155. The output of NOR gate 155 is connected to a second input of NOR gate 145 and to the bistable output lead 143. The output of NOR gate 145 is connected to a second input of NOR gate 155 and to the bistable output lead 144.

Referring now in more detail to the operation of the voltage-controlled oscillator, the effect of applying an input voltage to input terminal 101 is first considered. With the gate electrode 113 of P-channel transistor 110 connected to its drain electrode 109, that transistor functions as a diode. That is, since the gate-to-source voltage is equal to the voltage at drain electrode 109, transistor 110 begins to conduct when the voltage at drain electrode 109 exceeds the threshold voltage $P_{th}$. The threshold voltage $P_{th}$ for a P-channel MOSFET transistor device ($N_{th}$ for an N-channel device) is the minimum gate-to-source voltage that will cause the device to start conducting. Hence, a voltage equal to the supply potential $V_{dd}$ minus the diode drop or threshold voltage $P_{th}$ appears at the drain 107 of transistor 103.

When the input voltage $V_{in}$, connected between the input terminal 101 and ground, is above the threshold voltage $N_{th}$, the N-channel transistor 103 is turned on and saturated. The value of resistor 105 is chosen to be large relative to the source of drain impedance of saturated transistor 103, so that the voltage across resistor 105 is equal to the input voltage $V_{in}$ lever minus the threshold voltage $N_{th}$ of transistor 103. Thus, the current through resistor 105 is linearly dependent upon the input voltage $V_{in}$.

The current through resistor 105 establishes the level of saturation current flowing through diode-connected transistor 110. Additionally, since the voltage at the drain 109 of transistor 110 is clamped at $V_{dd}$ minus the threshold voltage $P_{th}$, a constant current which varies in dependence on the valve of $V_{in}$ flows through transistor 110 and resistor 108 as determined by the valve of resistor 108.

Transistor 115 is chosen to have the same characteristics, including threshold voltage, as transistor 110. Since the gate 114 of transistor 115 is connected to the gate 113 of transistor 110, the gate-to-source voltages of the two transistors are identical. Hence, the saturation current flowing in the matched transistor 115 is likewise established by the input voltage $V_{in}$ and the value of resistor 108. If transistors 110 and 115 are simultaneously fabricated on the same integrated circuit chip they will exhibit identical characteristics. Further, it is possible to vary the physical dimensions of the conductive channel of transistor 115 by a known factor during the fabrication process in order to control the gain thereof.

Assuming that initially the voltage across capacitor 135 is zero and the output of NOR gate 145 is in a low or negative (with respect to ground) potential state when the output of NOR gate 155 is in a high or positive (with respect to ground) potential state, the operation of the voltage-controlled oscillator is as follows.

With a high potential applied to the input terminal 133 of inverter 121, N-channel transistor 124 is fully turned on while P-channel transistor 123 is cut off. Similarly, with a low potential applied to the input terminal 133' of inverter 121', N-channel transistor 121' is cut off while the P-channel transistor 123' is fully turned on. Since output terminal 134 of inverter 121 is held low by transistors 123 and 124, the output of inverter 149 holds the first input of NOR gate 145 low.

Since the voltage across capacitor 135 is initially zero, the output of inverter 154 is also initially low. With a low potential at the output of inverter 154 and a high potential at the output of inverter 148, the output of AND gate 150 and, therefore, the first input of NOR gate 155 is likewise initially low. Cross-coupled NOR gates 145 and 155 are arranged in a conventional set-reset bistable circuit configuration. Hence, the output of bistable multivibrator 140 remains in a stable condition with the output of NOR gate 145 low and the output of NOR gate 155 high.

Figures 2A, 2B, 2C, 2D:
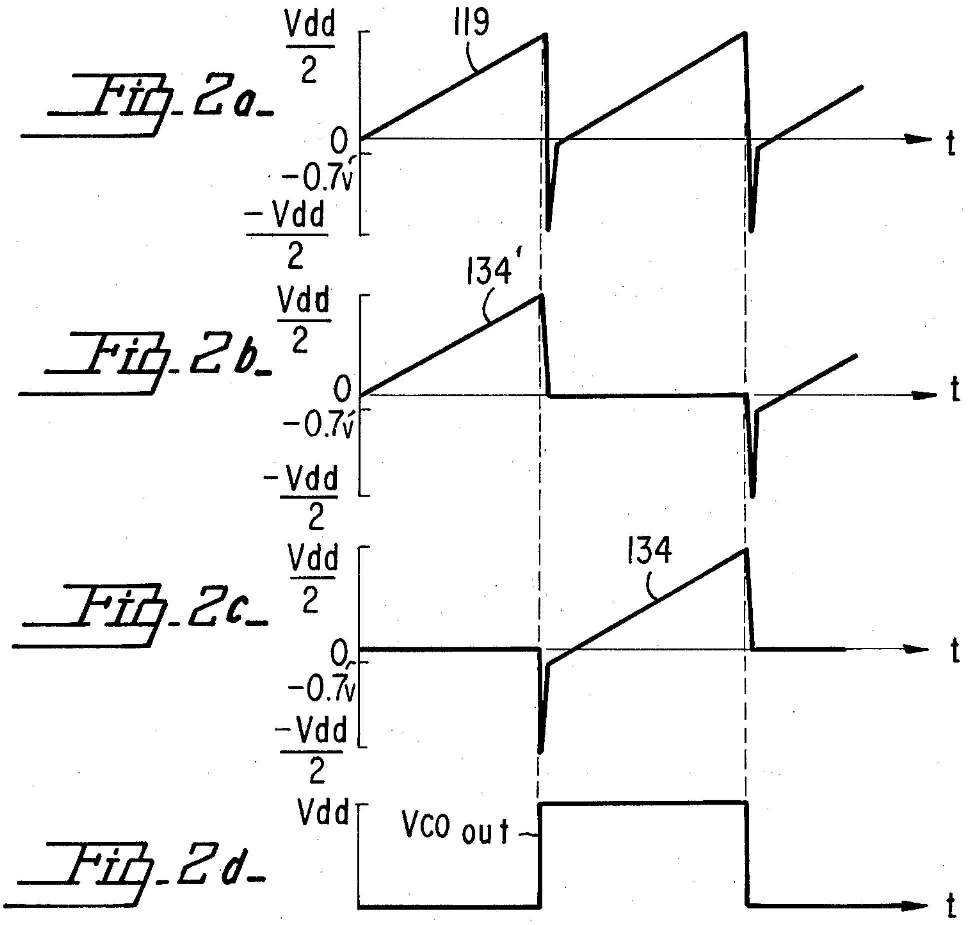
FIGS. 2*a* – 2*d* are graphic representations of the voltage waveforms which are produced in the voltage-controlled oscillator of FIG. 1.

To facilitate further description of the voltage-controlled oscillator of FIG. 1, reference is now made to FIGS. *2a–2d* wherein there are shown voltage waveforms appearing at various locations in the circuit of FIG. 1. The waveform of FIG. 2a is the voltage appearing at the input of bridge circuit 120. This waveform is labeled 119 in FIG. *2a* to indicate that it appears on lead 119 in FIG. 1.

In FIG. *2b* the waveform is labeled 134' as this is the waveform at the inverter output terminal 134'. The waveform of FIG. *2c*, labeled 134, is the waveform appearing at the inverter output terminal 134. In FIG. 2d the waveform labeled VCO out represents the voltage-controlled oscillator output voltage taken from the output terminal 156.

The constant (for a given value of $V_{in}$) current from transistor 115 linearly charges capacitor 135 through transistors 123' and 124 until the rising voltage at output terminal 134' of inverter 121' reaches the threshold voltage of inverter 151. As discussed in detail hereinafter, when the threshold voltage, which is typically $V_{dd}/2$, is reached the output of inverter 154 goes high.

With a high potential at the outputs of inverters 148 and 154, the output of AND gate 150 goes high. The bistable configuration of NOR gates 145 and 155 then changes state, wherein the output of NOR gate 145 goes high and the output of NOR gate 155 goes low. This turns transistors 124 and 123' off and transistors 123 and 124' on. Capacitor 135, which was charged to the threshold voltage $V_{dd}/2$ of inverter 151, is then low switched to ground at the output terminal 134' of inverter 121'; since the voltage across a capacitor cannot change instantaneously, the voltage at output terminal 134 of inverter 121 goes negative to a value equal to $-V_{dd}/$)

However, the drain-to-substrate path of transistor 124 acts as a forward biased diode to the negative voltage appearing at the output terminal 134. The diode is inherent in the design of semiconductor devices, such as MOSFET transistors, where a region consisting of one type of material is diffused into a substrate material having an opposite polarity. Capacitor 135 is, therefore, rapidly discharged to ground through the drain-to-substrate diode of transistor 124. The low impedance discharge path provides a negligible discharge time compared to the linear charging time of capacitor 135. The discharge continues until the voltage across capacitor 135 equals −0.7 volts, at which time the drain-to-substrate diode of transistor 124 cuts off. The constant current from transistor 115 then charges capacitor 135 linearly through transistors 123 and 124' until the rising voltage at output terminal 134 of inverter 121 reaches the threshold voltage of inverter 146.

Once the threshold voltage is reached the output of inverter 149 goes high. The bistable configuration of NOR gates 145 and 155 then changes state wherein the output of NOR gate 145 goes low and the output of NOR gate 155 goes high. This turns transistors 123 and 124' off and transistors 124 and 123' on. The negative voltage then appearing at the output terminal 134' causes the drain-to-substrate diode of transistor 124' to conduct thereby discharging capacitor 135. The discharge continues until the voltage across capacitor 135 equals −0.7 volts, at which time the entire cycle repeats itself.

The voltage at the drain electrode 118 of transistor 115 is equal to the difference between the supply voltage $V_{dd}$ and the voltage across capacitor 135. Since the current from transistor 115 charges capacitor 135 up to a voltage not exceeding the threshold voltage $V_{dd}/2$, transistor 115 operates with a minimum drain-to-source voltage of $V_{dd} - (V_{dd}/2.)$ Thus, transistor 115 continuously operates in saturation and, therefore, acts as a constant current source.

The output of the voltage-controlled oscillator is taken from output terminal 156. The bistable configuration of NOR gates 145 and 155 changes state each time capacitor 135 is charged to the threshold voltage of inverter 146 or inverter 151, thus, either output of bistable 140 provides a square wave output waveform. Since the same constant current source charges capacitor 135 in both directions, the output waveform is, therefore, a symmetrical square wave.

Serially connected inverters 146, 147, 148 and 149, and inverters 151, 152, 153 and 154 constitute delay networks. Still referring to FIG. 1, it can be seen that bistable 140 changes state once the voltage at either terminal of capacitor 135 reaches the threshold voltage $V_{dd}/2$. It is also apparent that the same threshold voltage is pulled low at the instant bistable multivibrator 140 changes state. However, a finite time is required for bistable multivibrator 140 to reach a stable state after an input signal is applied. Therefore, in the present invention, in order to allow sufficient time for bistable multivibrator 140 to completely change state before the threshold voltage $V_{dd}/2$ is removed, the input signals are retarded by the propagation delays of serially connected inverters 146, 147, 148, and 149, and inverters 151, 152, 153 and 154.

Under normal operating conditions one terminal of capacitor 135 is held at ground potential while the other terminal is charged up to the threshold voltage. If a positive voltage (with respect to ground) equal to or greater than the threshold voltage is simultaneously applied to both terminals of capacitor 135, — during, for example, initial turn-on when power is first applied to the circuit, or an accidental connection to $V_{dd}$ — the inputs to bistable 140 will be held high and both outputs will be driven low. Under these circumstances, transistors 123 and 123' will turn on and hold both terminals of capacitor 135 high; and, the voltage-controlled oscillator will stop oscillating.

However, in the present invention, AND gate 150 prevents such a latch-up condition and restores normal operation. It follows that whenever the output of inverter 149 is high, the output of inverter 148 must be low. Since the output of inverter 148 is connected to the second input of AND gate 150, the output of AND gate 150 will go low even though the first input may be held high. The low output provided by AND gate 150 causes the output of NOR gate 155 to go high so that transistor 124 turns on while transistor 124 cuts off. Normal operating conditions are thus restored and the voltage-controlled oscillator begins to oscillate.

Referring again to FIG. 1, an analysis of the voltage-controlled oscillator circuit yields the following equation for the frequency of operation. The current flowing through resistor 105 is $$i_{105} = \frac{(V_{in} - N_{th})}{R_{105}} \quad (1)$$

and the current flowing through resistor 108 is $$i_{108} = \frac{(V_{dd} - P_{th})}{R_{108}} \quad (2)$$

Thus, the total current flowing through transistor 110 and, therefore, transistor 115 is $$i_T = i_{105} + i_{108} \quad (3)$$

During each half-cycle of oscillation, capacitor 135 is charged from $$-0.7 \text{ volts to} + V_{dd}/2 \quad (4)$$

The current in capacitor 135 is $$i_T = C_{135}\,(dv/dt) \quad (5)$$

and since the current $i_T$, at any given value for $V_{in}$, is constant $$i_T = C_{135}\,(\Delta v/\Delta t) \quad (6)$$

For one complete period of oscillation, T, $$\Delta t = T \quad (7)$$

and $$\Delta V = 2\left(\frac{V_{dd}}{2} + 0.7\right) = V_{dd} + 1.4 \quad (8)$$

Thus $$T = \frac{C_{135}}{i_T}\,(V_{dd} + 1.4) \quad (9)$$

from which the frequency of operation can be computed using $$f_{osc} = \frac{1}{T} = \frac{i_T}{C_{135}(V_{dd} + 1.4)} \quad (10)$$

Substituting equation (3) into (10)

$$f_{osc} = \frac{(V_{in} - N_{th})}{R_{105}C_{135}(V_{dd} + 1.4)} + \frac{(V_{dd} - P_{th})}{R_{108}C_{135}(V_{dd} + 1.4)} \quad (11)$$

Factoring the constant terms of equation (11) yields $$f_{osc} = K_1\,(V_{in} - N_{th}) + K_2 \quad (12)$$

Where $K_1$ and $K_2$ represent the parameters which determine the range of operation.

It can be seen that the range of operating frequencies is determined by the values of capacitor 135, resistor 105 and resistor 108; and that the output frequency of the voltageecontrolled oscillator is controlled by varying the input voltage $V_{in}$. It is apparent from equation (12) above that the output frequency of the voltage-controlled oscillator of the present invention is linearly dependent upon its input voltage $V_{in}$ over the entire operating range.

Figures 3, 4:
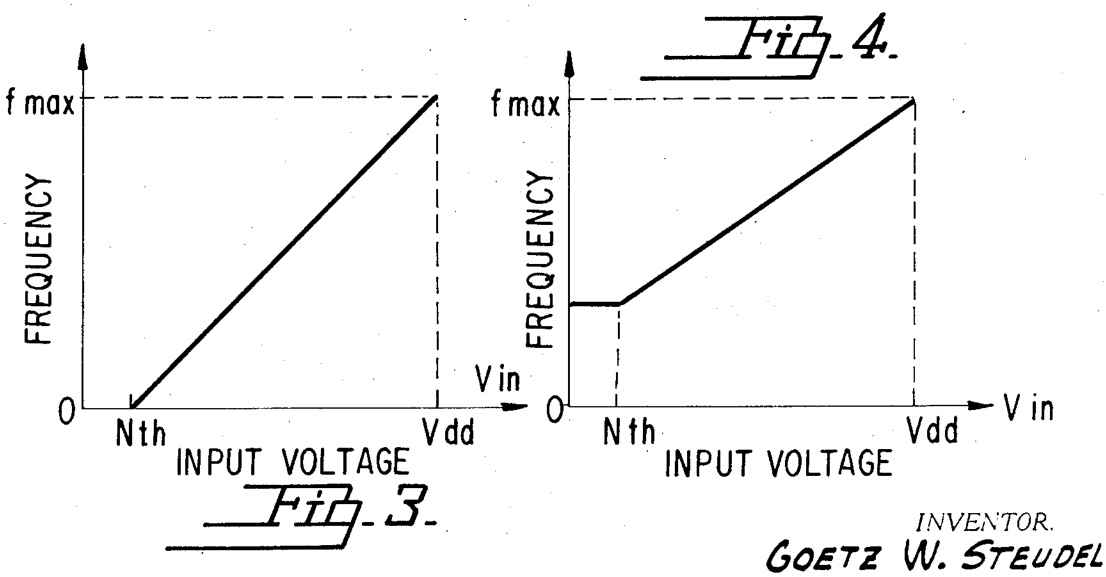
FIGS. 3 and 4 are graphic representations of the conversion characteristics of the voltage-controlled oscillator of FIG. 1.

Referring now to FIGS. 3 and 4 there are shown plots of the frequency vs. voltage conversion characteristics of the voltage-controlled oscillator of FIG. 1. FiG. 3 illustrates the frequency output over the range of input voltage $v_{in}$ when resistor 108, shown in FIG. 1 is removed from the circuit. The conversion characteristic when resistor 108 is of a finite value is illustrated in FIG. 4. The maximum operating frequency, $f_{max}$, as shown in FIGS. 3 and 4, occurs when $V_{in} = V_{dd}$. It can be seen that resistor 108 provides an initial output when $V_{in} = 0$ and acts to limit the slope of the conversion characteristic. Accordingly, the output frequency may be limited to a desired range by adjusting the resistance of resistor 108.

Figure 5:
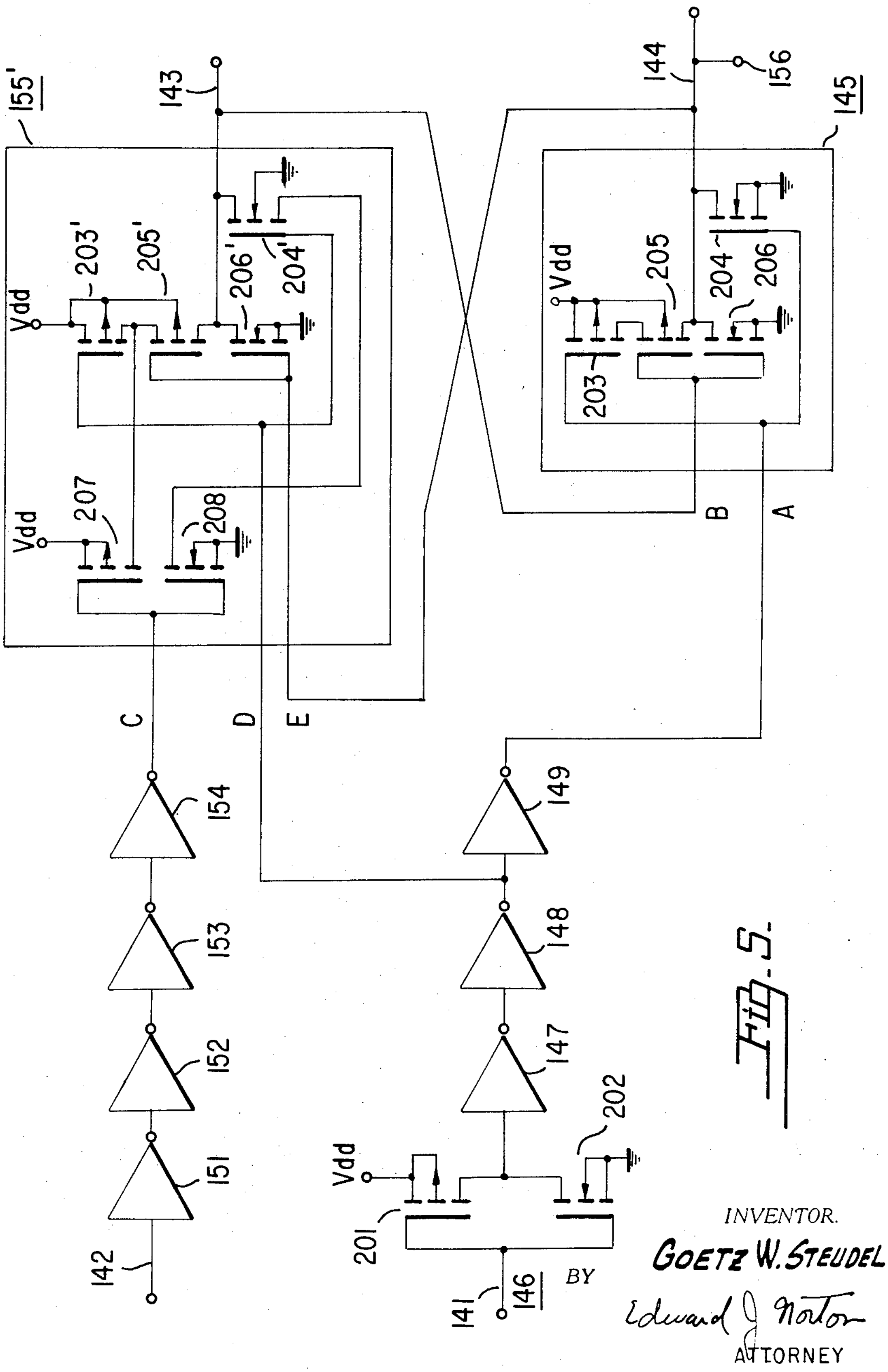
FIG. 5 is a schematic diagram of a bistable multivibrator suitable for use in the circuit shown in FIG. 1.

Referring now to FIG. 5, there is shown a schematic diagram of a bistable multivibrator suitable for use as the bistable multivibrator 140 of FIG. 1. In FIGS. 1 and 5, like elements bear like reference numerals. All transistors shown in FIG. 5 are of the MOSFET type and are operated in the enhancement mode. Inverter 146 comprises a P-channel transistor 201 and a complementary N-channel transistor 202. The gate electrodes of transistors 201 and 202 are connected to the inverter input terminal and the two drain electrodes are connected to the inverter output terminal. The source electrode and substrate of transistor 201 are connected to a positive supply potential $V_{dd}$, and the source electrode and substrate of transistor 202 are connected to ground.

When the voltage on input line 141 is above the threshold voltage ($V_{dd}/2$), transistor 202 is heavily turned on, therefore, representing a low impedance while transistor 201 is only turned on by a small gate-to-source voltage or cut off, therefore, representing a high impedance. Thus, the output terminal of inverter 146 goes low or to ground through transistor 202. When the input voltage is below the threshold voltage $V_{dd}/2$, transistor 201 is turned on and transistor 202 is cut off. In this case, the output terminal of inverter 146 goes high or to $V_{dd}$ through turned on transistor 201.

Inverters 147, 148, 149, 151, 152, 153 and 154 are identical in function and structure to inverter 146 as described above.

The first input A of NOR gate 145 is connected to the junction formed by the gate electrode of P-channel transistor 203 and the gate electrode of N-channel transistor 204. The source electrode and substrate of transistor 203 are connected to $V_{dd}$ while the source electrode and substrate of transistor 204 are connected to ground. The drain electrode of transistor 204 is connected to the junction formed by the drain electrode of P-channel transistor 205, the drain electrode of N-channel transistor 206 and the output terminal of NOR gate 145; and the drain electrode of transistor 203 is connected to the source electrode of transistor 205. The substrate of transistor 205 is connected along with the substrate of transistor 203 to $V_{dd}$ while the source electrode and substrate of transistor 206 are connected to ground. The gate electrodes of transistors 205 and 206 are connected to input B of NOR gate 145.

When both inputs A and B to NOR gate 145 are at a high potential, transistors 203 and 205 turn on while transistors 204 and 206 are cut off. Thus, the output of NOR gate 145 goes high. Any other combination of inputs to NOR gate 145 causes its output to go low. The output state for every combination of inputs is summarized in the truth table shown in Table 1. The truth value of logic "1" represents a positive voltage with respect to ground, referred to herein as a high. A logic "0" value represents a voltage that is at ground potential or low.

TABLE 1

| Input A | Input B | Output |
|---|---|---|
| 0 | 0 | 1 |
| 0 | 1 | 0 |
| 1 | 0 | 0 |
| 1 | 1 | 0 |

If the output of a conventional two-input AND gate is connected to input A of NOR gate 145, the output of NOR gate 145, for every combination of inputs, may be summarized as in Table 2 below. The first AND gate input is designated A' and the second A''.

TABLE 2

| Input A' | Input A'' | Input B | Output |
|---|---|---|---|
| 0 | 0 | 0 | 1 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

The first input C of combined AND/NOR gate 155' is connected to the junction formed by the gate electrode of P-channel transistor 207 and the gate electrode of N-channel transistor 208. The source electrode and substrate of transistor 208 are connected to ground while the source electrode and substrate of transistor 207 are connected to $V_{dd}$. The drain electrode of transistor 207 is connected to the junction formed by the drain electrode of P-channel transistor 203' and the source electrode of P-channel transistor 205'. The drain electrode of transistor 208 is connected to the source electrode of N-channel transistor 204'. The drain electrode of transistor 204' is connected to the junction formed by the drain electrode of transistor 205', the drain electrode N-channel transistor 206' and the output terminal of AND/NOR gate 155', and the substrate of transistor 204' is connected to ground.

The source electrode and substrate of transistor 206' are connected to ground while the source electrode and substrate of transistor 203' are connected along with the substrate of transistor 205' to $V_{dd}$. The junction formed by gate electrodes of transistors 203' and 204' is connected to the second input D of AND/NOR gate 155'. Input E is connected to the junction formed by the gate electrodes of transistors 205' and 206'.

With a low potential applied to inputs C, D and E, P-channel transistors 207, 203' and 205' turn on while N-channel transistors 208, 204' and 206' cut off, Thus, the output of AND/NOR gate 155' goes high through the turned on transistors. When a high potential is applied to inputs C, D and E, transistors 207, 203' and 205' cut off while transistors 208, 204' and 206' turn on. In this case, the output of AND/NOR gate 155' goes low through the turned on transistors. The output state of AND/NOR gate 155' for every combination of inputs is summarized in the truth table shown as Table 3 below.

TABLE 3

| Input C | Input D | Input E | Output |
|---|---|---|---|
| 0 | 0 | 0 | 1 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

It can be seen that Table 3 agrees with Table 2 above. Thus, AND/NOR gate 155' is identical in function to a conventional two-input NOR gate wherein the output of a conventional two-input AND gate is connected to one input of the NOR gate. It can also be seen that whenever inputs D and E are low the output of AND/NOR gate 155 will go high. Thus, when AND/NOR gate 155' and NOR gate 145 are cross-coupled in a set-reset flip-flop configuration, as shown in FIG. 5, a high applied to inputs A and C will render the output of AND/NOR gate 155' high.

In a conventional bistable configuration, without the AND gate function, the outputs of the cross-coupled NOR gates would be forced low. Under these conditions, the circuit shown in FIG. 1 would latch-up and the voltage controlled oscillator would, therefore, stop oscillating.

In the voltage-controlled oscillator of the present invention, low power dissipation and high input impedance are achieved by using complementary MOSFET semiconductor devices. It has been shown that during the quiescent period between switching states, the transistors of each inverter and the bistable multivibrator are either fully turned on or cut-off. Thus, the current drain through these stages is limited to the leakage current of the cut-off transistors.

Since the resistors (i.e. 105 to 108) in the constant current source are typically of large value (in the order of $0.5 \times 10^6$ ohms), the capacitor charging current is very low. Therefore, the total power consumption is attributable to leakage current, the current drain during the brief switching transition and the current required to charge the capacitor.

In actual operation, using a 10 volt power supply, the total current drain of the voltage-controlled oscillator is substantially less than 1 milliampere. Additionally, since the input impedance of a MOSFET transistor is extremely high, (in the order of $10^{11}$ ohms) the voltage-controlled oscillator of the present invention likewise exhibits a high input impedance.

While described in conjunction with complementary MOSFET semiconductor devices, the circuits of the present invention may also be constructed utilizing other types of semiconductor devices including insulated-gate transistors, diffused-junction field-effect transistors and, indeed, bipolar transistors. However, as described above, the preferred construction utilizes MOSFET semiconductor devices.

The voltage-controlled oscillator of the present invention may be used over a range of frequencies extending from a fraction of one cycle per second up to several tens of megacycles. The useable upper limit of operation is largely determined by stray capacitances present in any physical circuit configuration.

As described above, the present invention provides an improved voltage-controlled oscillator having an operating-frequency output which varies linearly, in response to an input voltage, from zero frequency up to the maximum frequency output, a high input impedance, and low power dissipation. The voltage-controlled oscillator herein described is, therefore, particularly suited for integrated circuit applications.

What is claimed is:

1. A voltage-controlled oscillator comprising:

a bridge circuit including first, second, third and fourth transistors, each of said transistors having a control electrode and two main electrodes, said main electrodes of said first and second transistors being serially coupled to form one arm of said bridge, and said main electrodes of said third and fourth transistors being serially coupled to form the other arm of said bridge;

means for coupling a current source between a first terminal formed by the junction of the remaining main electrodes of said first and third transistors and a second terminal formed by the junction of the remaining main electrodes of said second and fourth transistors;

a bistable circuit having a first input coupled to a third terminal formed by the junction of said first and second transistors and a second input coupled to a fourth terminal formed by the junction of said third and fourth transistors, a capacitive impedance coupling said first input to said second input, said bistable circuit changing state in response to input signals at said first and second inputs;

means for coupling a first output of said bistable circuit to the control electrodes of said first and second transistors, and further coupling a complementary output of said bistable circuit to the control electrodes of said third and fourth transistors; and means for coupling an output terminal to one of said outputs of said bistable circuit.

2. A voltage-controlled oscillator comprising first and second inverters each comprising a pair of serially connected complementary transistors having commonly connected input electrodes wherein one transistor switches off when the other transistor switches on in response to an input signal to said commonly connected electrodes, means for coupling the remaining electrodes of the transistors of each of said inverters in series across a current supply whose value varies in accordance with an input voltage, bistable means having a first input coupled to the output of said first inverter, a second input coupled to the output of said second inverter, a first output coupled to said input electrode of said first inverter and a second output coupled to said input electrode of said second inverter, a frequency control circuit for said voltage-controlled oscillator comprising a capacitive impedance coupled between said output of said first inverter and said output of said second inverter and control means for varying the output level of said current supply, and means for deriving a voltage-controlled oscillator output from said bistable means.

3. The oscillator according to claim 1 wherein said transistors are each metal oxide silicon field effect transistors.

4. The oscillator according to claim 1 wherein each of said arms comprises a P-channel metal oxide silicon field effect transistor and an N-channel metal oxide silicon field effect transistor.

5. The oscillator according to claim 4 including means coupled to said transistors for operating each of said transistors in the enhancement mode.

6. The oscillator according to claim 1 wherein said current source includes means for providing a continuously-variable current which varies linearly in response to an input voltage.

7. The oscillator according to claim 6 wherein said current source comprises first and second semiconductor means coupled between said first terminal and a power supply wherein the conductivity of said first semiconductor means is controlled by the conductivity of said second semi-conductor means coupled to said first semiconductor means.

8. The oscillator according to claim 7 wherein said first semiconductor means comprises a fifth transistor having an input electrode coupled to said second semiconductor means and means for coupling the remaining electrodes of said fifth transistor between said first terminal and said power supply.

9. The oscillator according to claim 8 wherein said second semiconductor means includes a diode, a sixth transistor and a first resistor serially coupled across said power supply, said sixth transistor having an input electrode coupled to said input voltage.

10. The oscillator according to claim 9 wherein said diode comprises a seventh transistor having a control electrode and two main electrodes, said control electrode being coupled to one of said main electrodes.

11. The oscillator according to claim 10 wherein said fifth transistor and said seventh transistor have substantially identical threshold voltage characteristics.

12. The oscillator according to claim 11 wherein said second semiconductor means further includes means coupled to said second semiconductor means to provide a predetermined conductivity independent of said input voltage.

13. The oscillator according to claim 12 wherein said means coupled to said second semiconductor means comprises a second resistor coupled across said sixth transistor and said first resistor.

14. The oscillator according to claim 1 wherein said bistable circuit includes delay means for retarding said input signals applied to said bistable circuit.

15. The oscillator according to claim 14 wherein said delay means comprises at least one inverter serially coupled with said first input and at least one inverter serially coupled with said second input, said inverters each comprising a pair of MOSFET complementary transistors having their gate electrodes coupled together and their drain electrodes connected together and means for coupling the source electrodes of each inverter across a power supply.

16. The oscillator according to claim 15 wherein said bistable circuit includes a pair of cross-coupled NOR gates having input terminals coupled to said first input and said second input and output terminals coupled to said first output and said complementary output.

17. The oscillator according to claim 16 wherein said bistable circuit further includes an AND gate, said AND gate having an output terminal coupled to one input terminal of said NOR gates, a first input terminal of said AND gate being coupled to said first input of said bistable circuit and a second input terminal of said AND gate being coupled to said second input of said bistable circuit, so that said bistable circuit exhibits a predetermined output state when said signals are simultaneously applied to said first and second input.

18. The oscillator according to claim 2 wherein said control means includes means for varying said output level of said current supply in response to an input voltage.

19. A voltage-controlled oscillator comprising:

a bridge circuit having first and second inverters, each comprising a pair of serially connected MOSFET transistors, each inverter comprising a P-channel transistor and an N-channel transistor with their gates connected together and their drains connected together, means for coupling the source electrodes of each inverter across a current supply whose value varies in accordance with an input voltage, a capacitor coupled between said drains of said first inverter and said drains of said second inverter, a bistable circuit having a first input coupled to one terminal of said capacitor and a second input coupled to the other terminal of said capacitor, a first output coupled to said gates of said first inverter and a second output coupled to said gates of said second inverter, said bistable circuit changing state in response to signals representative of a predetermined charge being stored across said capacitor, a frequency control circuit for said voltage-controlled oscillator comprising means for linearly varying the output of said current supply, and means for deriving a voltage-controlled oscillator output from one output of said bistable circuit.

20. The oscillator according to claim 19 wherein said current supply includes a third P-channel MOSFET transistor having a source electrode coupled to a substantially fixed point of potential with respect to a point of reference potential, a drain electrode coupled to said bridge circuit and a gate electrode coupled to said means for varying said output of said current supply.

21. The oscillator according to claim 20 wherein said means for varying said output of said current supply includes:

a fourth P-channel MOSFET transistor having a source electrode coupled to said fixed point of reference potential, and gate and drain electrodes coupled to said gate electrode of said third P-channel transistor, a third N-channel MOSFET transistor having a drain electrode coupled to said gate and drain electrodes of said fourth transistor, a source electrode coupled to said point of reference potential through a first resistor and a gate electrode coupled to said input voltage, so that the current output from said current supply varies in accordance with said input voltage.

22. The oscillator according to claim 21 wherein said means for varying said output of said current supply further includes a second resistor coupled between said drain electrode of said third N-channel transistor and said point of reference potential, whereby a predetermined constant current output from said current supply, independent of said input voltage, is provided.

23. The oscillator according to claim 22 wherein said bistable circuit includes a pair of cross-coupled NOR gates having input terminals coupled to said first input and said second input and output terminals coupled to said first output and said second output, and delay means for retarding said signals.

* * * * *